United States Patent [19]

Hartoog et al.

[11] Patent Number: 5,295,088
[45] Date of Patent: Mar. 15, 1994

[54] METHOD FOR PREDICTING CAPACITANCE OF CONNECTION NETS ON AN INTEGRATED CIRCUIT

[75] Inventors: Mark R. Hartoog, Los Gatos; Robert D. Shur, Los Altos, both of Calif.

[73] Assignee: VLSI Technology, Inc., San Jose, Calif.

[21] Appl. No.: 89,385

[22] Filed: Jul. 9, 1993

Related U.S. Application Data

[63] Continuation of Ser. No. 630,462, Dec. 19, 1990, abandoned.

[51] Int. Cl.⁵ .............................................. G06F 15/60
[52] U.S. Cl. .................................. 364/578; 364/488; 364/490
[58] Field of Search ............... 364/578, 488, 489, 490; 395/500

[56] References Cited

U.S. PATENT DOCUMENTS

| | | | |
|---|---|---|---|
| 4,763,289 | 8/1988 | Barzilai et al. | 364/578 |
| 4,815,024 | 3/1989 | Lewis | 364/578 |
| 5,107,320 | 4/1992 | Iranmanesh | 357/52 |

OTHER PUBLICATIONS

Kortekaas; "On-Chip Quasi-static Floating-gate Capacitance Measurement Method"; IEEE Conf on Microelectronics; Mar. 1990.

Primary Examiner—Jack B. Harvey
Assistant Examiner—Ellis B. Ramirez
Attorney, Agent, or Firm—Douglas L. Weller

[57] ABSTRACT

A method estimates the interconnect capacitance of a first net in an integrated circuit. The first step of the method includes the generation of a value which indicates how tightly connected to one another are components connected to the first net. The second step of the method includes the prediction of interconnect capacitance of the first net based on the value generated in the first step and a number representing how many components are connected to the first net.

11 Claims, 3 Drawing Sheets

METHOD FOR PREDICTING CAPACITANCE OF CONNECTION NETS ON AN INTEGRATED CIRCUIT

This application is a continuation of copending application Ser. No. 07/630,462, filed Dec. 19, 1990, now abandoned.

BACKGROUND

The present invention concerns the prediction of the capacitance of connection nets after they are placed on an integrated circuit.

In integrated circuits, delay through a component is dependent upon the load the component is required to drive. The load a component has to drive is dependent upon the fanout from the output of the component and dependent upon the length of connection lines which are part of the output net of the component.

When designing integrated circuits, it is important in estimating performance of the integrated circuit to estimate the delay through components. After the logic of the circuit has been designed, and before the integrated circuit has been manufactured, it is possible to determine the fanout from each component. However, the length of the connection wires which form the output net of the component and the resulting interconnect capacitance of the output net are difficult to predict with accuracy.

Typically, in the prior art, this net capacitance has been estimated solely on the basis of fanout from the component and empirically determined constants. For example the following Formula 1 or other similar formulas are typically used to determine the interconnect capacitance of nets.

$$\text{Capacitance} = c_1 + c_2 * \text{Fanout} \qquad \text{Formula 1}$$

In the above Formula 1, Fanout is the number of components driven by the output of the component, Capacitance is the predicted capacitance of the output net from the component and $c_1$ and $c_2$ are constants which are determined from statistics of previously routed designs. Besides using a straightforward formula as Formula 1 above, some attempts have been made to use more elaborate procedures to calculate net capacitance based on fanout. Such procedures generally use tables which indicate statistically typical values for capacitance as a function of fanout. Some tables take into account floor planning information available at the time the prediction is made.

One problem with the prior methods of predicting the capacitance of nets is the wide variation in the actual value of the capacitance of nets. For example, for most output nets with a fanout of 1, the connection lines are short and so the capacitance of the net is low. However, a small number of nets have much longer connection lines and thus much greater capacitance. If standard statistical techniques are used to predict capacitance of output nets, most of the nets will have less capacitance than the predicted value, while a small number of the output nets will have a capacitance which is several times greater than the predicted value. If one or more of the output nets with significantly greater capacitance is on a circuit path which is critical to performance, then the performance of the integrated circuit may be less than predicted. Such impaired performance of all or a section of an integrated circuit could require a designer to manually re-route connection lines in an integrated circuit. In some cases, it is required to redesign the logic of the integrated circuit.

One way to avoid the problem of significantly underestimating the capacitance of nets of some components is to simply predict much larger capacitance for all nets. This would guarantee that the predicted capacitance would be much closer for those few components with nets having significantly greater capacitance. However, using such inflated predictive values would generally result in underestimating actual performance of the integrated circuit.

SUMMARY OF THE INVENTION

In accordance with the preferred embodiment of the present invention, a method is presented for estimating the interconnect capacitance of a first net in an integrated circuit. The first step of the method includes the generation of a value which indicates how tightly connected to one another are components connected to the first net. The second step of the method includes the prediction of interconnect capacitance of the first net based on the value generated in the first step and a number representing how many components are connected to the first net.

The generation of the value in the first step may be performed in a number of ways. For example, for each component connected to the first net, a number of components that can be reached without traversing the first net and by traversing no more than a preselected maximum number of nets in the integrated circuit is ascertained. Then, a total number of components in a union of all components that can be reached from a component connected to the first net without traversing the first net and by traversing no more than a preselected maximum number of nets in the integrated circuit is calculated. Finally, the value is set equal to the ratio of a sum of all the numbers ascertained for each component connected to the net over the total number of components in the union.

Alternately, the first step may be performed by first, for each component connected to the first net, determining a fewest number of nets that need to be traversed to reach another component connected to the first net without traversing the first net. Then the value is set equal to one plus, for each component connected to the first net, an inverse of the fewest number of nets that need to be traversed to reach another component connected to the first net without traversing the first net.

The second step of the method may also be performed in a number of ways. Essentially, when predicting the interconnect capacitance, the predicted interconnect capacitance should increase when the number representing how many components are connected to the first net increases, and the predicted interconnect capacitance should decrease when the value which indicates how tightly connected to one another are components connected to the first net increases. For example the predicted interconnect capacitance may be set equal to a ratio of a sum to the value which indicates how tightly connected to one another are components connected to the first net. The sum is equal to a first constant plus a product of a second constant times the number representing how many components are connected to the first output.

DESCRIPTION OF THE PREFERRED EMBODIMENT

Figure 1:
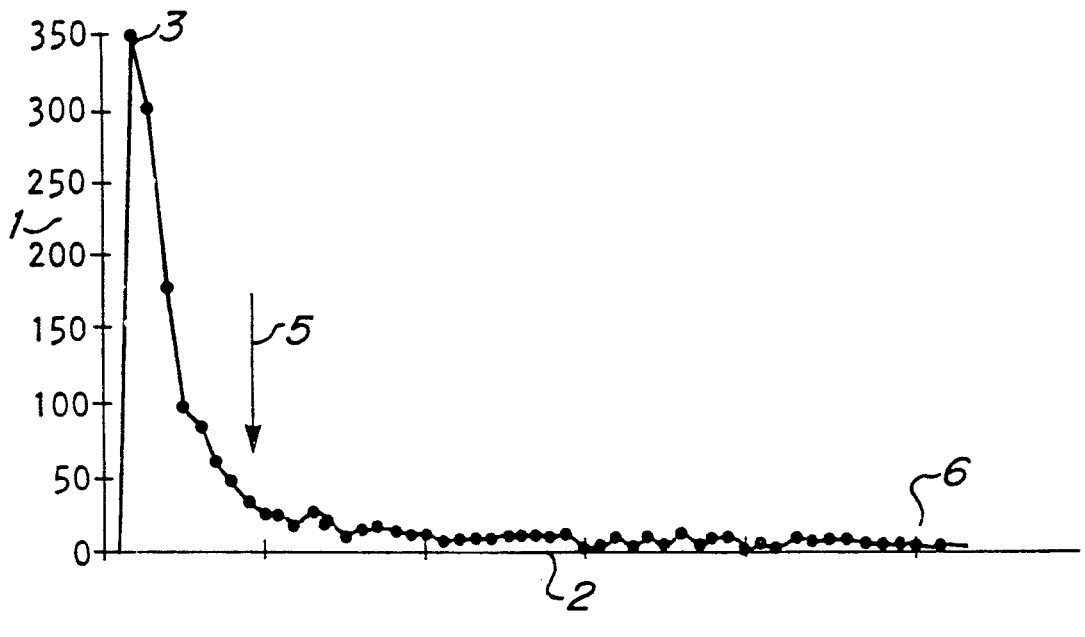
FIG. 1 shows a histogram of interconnect capacitance of fanout one nets in a typical integrated circuit.

FIG. 1 shows a histogram 3 of interconnect capacitance of fanout one nets in a typical integrated circuit. Histograms for nets with a fanout of greater than one would be similar in appearance to histogram 3, but shifted to the right.

In FIG. 1, horizontal axis 2 indicates values for interconnect capacitance. Vertical axis 1 shows the number of nets for each level of interconnect capacitance. An arrow 5 marks a typical value for the predicted capacitance of fanout one nets for an integrated circuit with histogram 3. However, there are fanout one nets having interconnect capacitance in a range 6 of interconnect capacitance where the typical interconnect capacitance is much greater than the typical value marked by arrow 5. If one or more of the nets in range 6 are on a circuit path which is critical to performance, than the performance of the integrated circuit may be less than predicted. The present invention offers a better way of predicting interconnect capacitance.

Once logic for an integrated circuit has been designed, automatic placement and routing algorithms are used to place the logic on the integrated circuit. The automatic placement and routing algorithms generally try to minimize the total length of all wires in the integrated circuit. As a result of this nets between logic components in close proximity to each other tend to be made of short connection lines and thus have a low connection capacitance. Nets between connected logic components located not in immediate proximity on the integrated circuit tend to be made of longer connection lines and thus have a higher connection capacitance.

Figure 2:
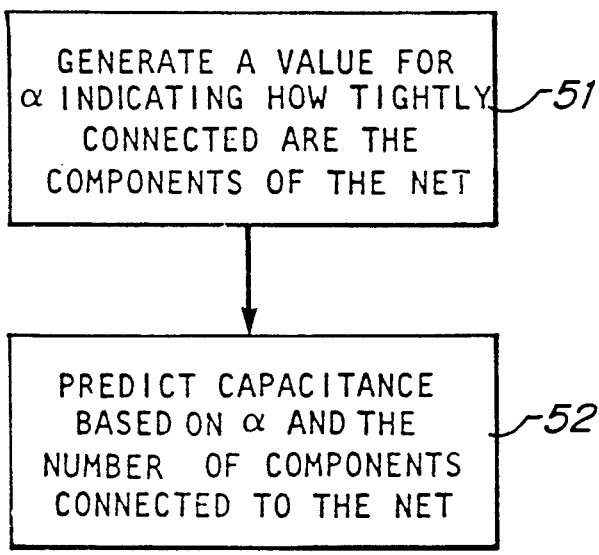
FIG. 2 shows a simplified flow chart of a method in accordance with the preferred embodiment of the present invention.

FIG. 2 shows a method which takes into account the methodology of the automatic placement and routing algorithms in order to determining the interconnect capacitance of nets. In a step 51 of the method, there is generated a value $\alpha$ which indicates how tightly connected components of a net are in order to predict an interconnect capacitance for the net. In general, components of a first net are considered to be tightly connected when separating the components on an integrated circuits results in increasing the interconnect capacitance of the first net as well as the interconnect capacitance of a number of other nets. The components of the first net are not considered to be tightly connected when separating the components on an integrated circuits results in increasing the interconnect capacitance of only the first net.

Figure 3:
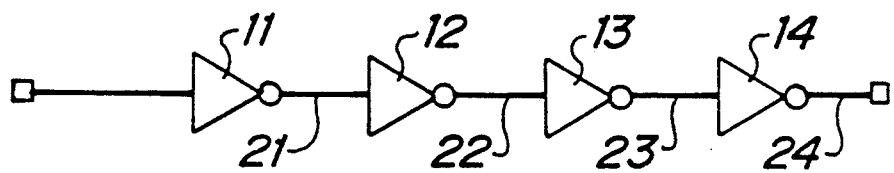
FIGS. 3 and 4 show simple circuits used for illustration of the principles of the present invention.

For example, in FIG. 3, a logic component 11 has an output net 21, a logic component 12 has an output net 22, a logic component 13 has an output net 23 and a logic component 14 has an output net 24. Net 22 is connected to component 12 and component 13. If component 12 is located far from component 13—provided component 11 is located near component 12 and component 14 is located near component 13—this causes only net 22 to be long and thereby have a high interconnect capacitance. Therefore, logic component 12 and logic component 13 of net 22 are not considered to be tightly connected.

Figure 4:
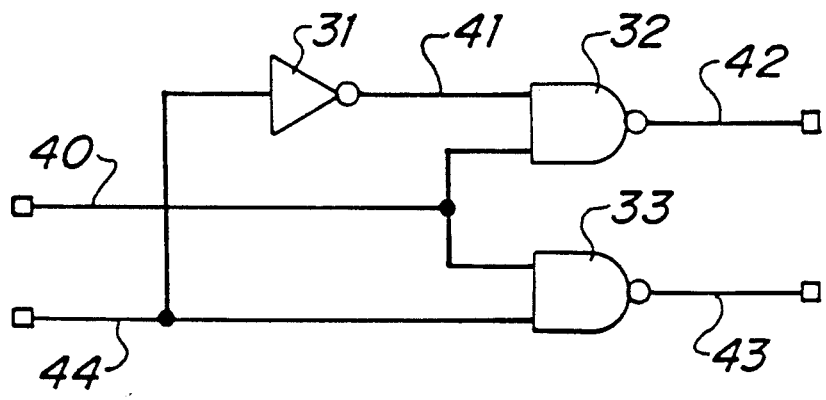

In FIG. 4, a logic component 31 has an output net 41, a logic component 32 has an output net 42 and a logic component 33 has an output net 43. Net 41 is connected to component 31 and component 32. Component 31, however, is connected to component 33 through a net 44 and component 32 is connected to component 33 through a net 40. If, therefore, component 31 is located far from component 32, net 41 would be long, thus having a high interconnect capacitance, but also either or both of net 40 and net 44 would be long and thus have a high interconnect capacitance. Components 31 and 33 of net 41 are thus more tightly connected than components 12 and 13 of net 22.

The value $\alpha$ which indicates how tightly connected a net is may be generated in a number of ways. For example, one method of generating $\alpha$ includes the following steps:

First, for each component on the first net, ascertain the number of components that can be reached by traversing a maximum of nets from the component but without traversing the first net. The number n is a preselected integer which is greater than or equal to one.

Second, calculate a total number of components in a union of all components that can be reached from any component on the first net by traversing a maximum of n nets from the component but without traversing the first net.

Third, make $\alpha$ equal to the ratio of the sum of the number of components ascertained in the first step to the total number calculated in the second step.

Figure 5:
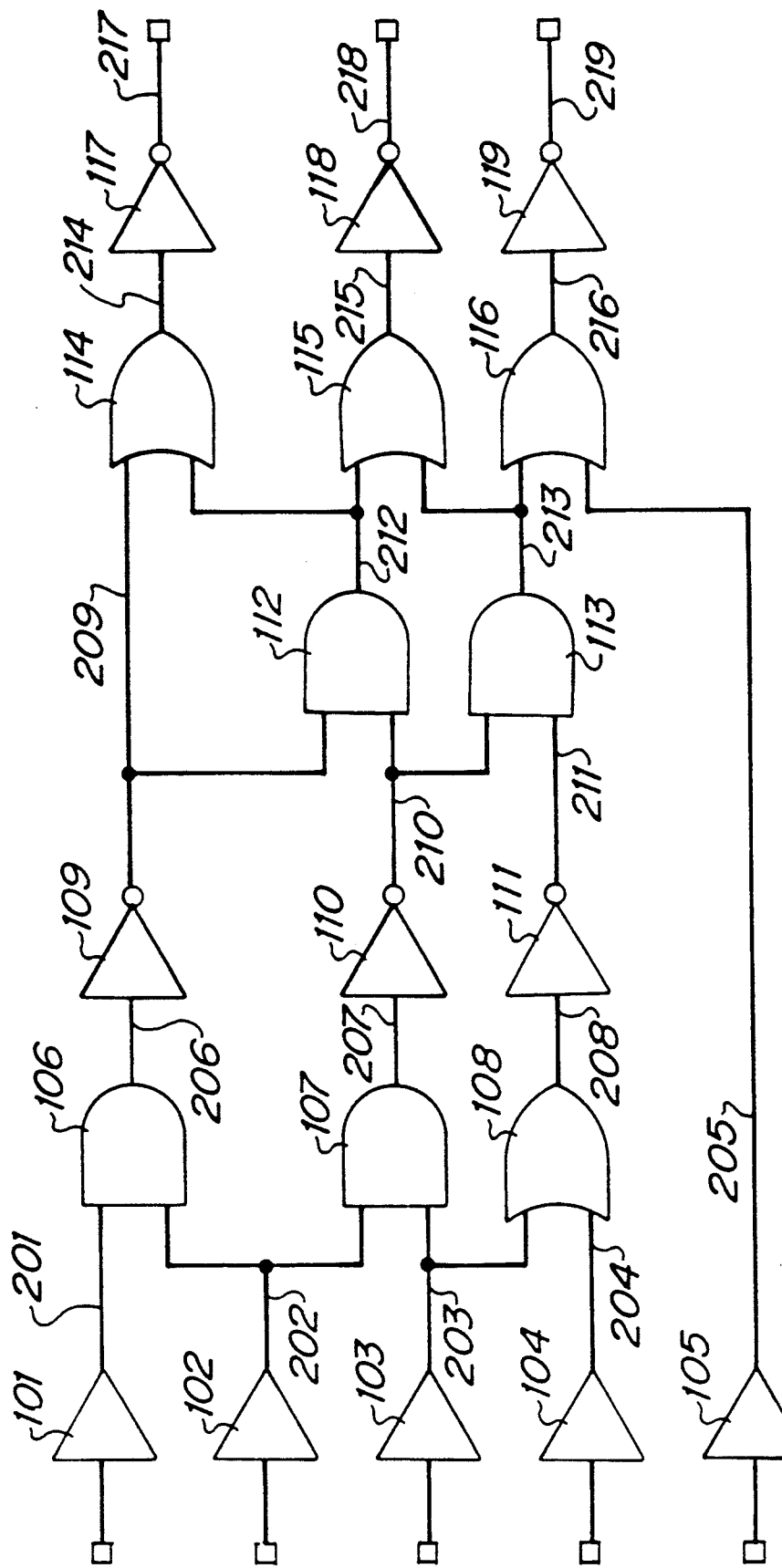
FIG. 5 shows a circuit used to illustrate the method described in FIG. 2 in accordance with the preferred embodiment of the present invention.

The above method by which $\alpha$ is generated may be illustrated by considering the circuit shown in FIG. 5. In FIG. 5, a logic component 101 has an output net 201, a logic component 102 has an output net 202, a logic component 103 has an output net 203, a logic component 104 has an output net 204, a logic component 105 has an output net 205, a logic component 106 has an output net 206, a logic component 107 has an output net 207, a logic component 108 has an output net 208, a logic component 109 has an output net 209, a logic component 110 has an output net 210, a logic component 111 has an output net 211, a logic component 112 has an output net 212, a logic component 113 has an output net 213, a logic component 114 has an output net 214, a logic component 115 has an output net 215, a logic component 116 has an output net 216, a logic component 117 has an output net 217, a logic component 118 has an output net 218 and a logic component 119 has an output net 219.

The value $\alpha$ for net 210, where n is equal to one, is generated as follows.

First, for each of component 110, component 112 and component 113 on net 210, the number of components that can be reached by traversing a maximum of one net from the component but without traversing net 210 is ascertained. From FIG. 5, it may be seen that from component 110, two components may be reached—component 110 and component 107. From component 112, four components may be reached—component 112, component 109, component 114 and component 115. From component 113, four components may be reached—component 113, component 111, component 115 and component 116.

Second, a total number of a union of all components that can be reached from any component by traversing a maximum of on net from the component but without traversing net 210 is calculated. This may be done by, for example, by counting the number of components which are in a union of all the components ascertained in the first step. The union includes components 107, 109, 110, 111, 112, 113, 114, 115 and 116 for a total number of 9.

Third, $\alpha$ is made equal to the ratio of the sum of the number of components ascertained in the first step to the total number calculated in the second step. That is:

$$\begin{aligned} \alpha &= (2 + 4 + 4)/9 \\ &= 10/9 \\ &\simeq 1.11 \end{aligned}$$

Similarly, the value $\alpha$ for net 210, where n is equal to two, is generated as follows.

First, for each of components 110, 112 and 113 on net 210, the number of components that can be reached by traversing a maximum of two nets from the component but without traversing net 210 is ascertained. From FIG. 5, it may be seen that from component 110, six components may be reached—components 110, 102, 103, 106, 107 and 108. From component 112, nine components may be reached—components 112, 106, 109, 113, 114, 115, 116, 117 and 118. From component 113, ten components may be reached—components 113, 105, 108, 111, 112, 114, 115, 116, 118 and 119.

Second, a total number of a Union of all components that can be reached from any component by traversing a maximum of one net from the component but without traversing net 210 is calculated. The union of components includes components 102, 103, 105, 106, 107, 108, 109, 110, 111, 112, 113, 114, 115, 116, 117, 118 and 119 for a total number of 17.

Third, $\alpha$ is made equal to the ratio of the sum of the number of components ascertained in the first step to the total number calculated in the second step. That is:

$$\begin{aligned} \alpha &= (6 + 9 + 10)/17 \\ &= 25/17 \\ &\simeq 1.47 \end{aligned}$$

The value $\alpha$ for the first net may be generated using other methods. For example, the following method may be used:

First, for each component connected to the first net, determine the smallest number of nets that need to be traversed to reach another component connected to the first net without traversing the first net.

Second, make $\alpha$ equal to one plus, for every component connected to the first net, the inverse of the smallest number of nets traversed to reach another component connected to the first net without traversing the first net. If there is no path from one component to another, the path length is considered to be infinite and its inverse zero. Using this method of generating the value $\alpha$, $\alpha$ may range from one (when there are no paths between components connected to the first net which do not traverse the first net) to one plus the number of components connected to the first net (when each component connected to the first net is, by another net, directly connected to one of the other components connected to the first net).

The above method by which $\alpha$ is generated may also be illustrated by considering the circuit shown in FIG. 5. For example, using the above method, the value $\alpha$ for net 210 is generated as follows:

First, for each of components 110, 112 and 113 connected to net 210, the length of the shortest path to any other component connected to net 210 is found.

From component 110 to component 112, the shortest path is through net 207 to component 107, through net 202 to component 106, through net 206 to component 109 and through net 209 to component 112, for a total of four nets traversed. From component 110 to component 113, the shortest path is through net 207 to component 107, through net 203 to component 108, through net 208 to component 111 and through net 211 to component 113 for a total of four nets traversed. The smallest number of nets that need to be traversed, therefore, from component 110 to either component 112 or component 113 is four.

From component 112 to component 110, the shortest path is through net 209 to component 109, through net 206 to component 106, through net 202 to component 107 and through net 207 to component 110, for a total of four nets traversed. From component 112 to component 113, the shortest path is through net 212 to component 115 and through net 213 to component 113 for a total of two nets traversed. The smallest number of nets that need to be traversed, therefore, from component 112 to either component 110 or component 113 is two.

From component 113 to component 110, the shortest path is through net 211 to component 111, through net 208 to component 108, through net 203 to component 107 and through net 207 to component 110, for a total of four nets traversed. From component 113 to component 112, the shortest path is through net 213 to component 115 and through net 212 to component 112 for a total of two nets traversed. The smallest number of nets that need to be traversed, therefore, from component 112 to either component 110 or component 112 is two.

Second, $\alpha$ is made equal to one plus, for each of components 110, 112 and 113, the inverse of the smallest number of nets traversed to reach another component connected to net 210 without traversing net 210. From the determinations made in the first step:

$$\begin{aligned} \alpha &= 1 + 1/4 + 1/2 + 1/2 \\ &= 2.25 \end{aligned}$$

As another example, the value $\alpha$ for net 213 is also generated.

First, for each of components 113, 115 and 116 connected to net 213, the length of the shortest path to any other component connected to net 213 is found.

From component 113 to component 115, the shortest path is through net 210 to component 112 and through net 212 to component 115, for a total of two nets traversed. There is no path from component 113 to component 116 that does not traverse net 213. The smallest number of nets that need to be traversed, therefore, from component 113 to either component 115 or component 116 is two.

From component 115 to component 113, the shortest path is through net 212 to component 112 and through net 210 to component 113, for a total of two nets traversed. There is no path from component 115 to component 116 that does not traverse net 213. The smallest number of nets that need to be traversed, therefore, from component 115 to either component 113 or component 116 is two.

There is no path from component 116 to component 113 that does not traverse net 213. There is no path from component 116 to component 115 that does not traverse net 213. The smallest number of nets that need to be traversed, therefore, from component 116 to either component 113 or component 115 is infinity.

Second, $\alpha$ is made equal to one plus, for each of components 113, 115 and 116, the inverse of the smallest number of nets traversed to reach another component connected to net 213 without traversing net 213. From the determinations made in the first step:

$$\alpha = 1 + 1/2 + 1/2 + 1/\text{infinity}$$
$$= 2.00$$

In step 52 shown in FIG. 2, once a value for $\alpha$ has been generated for a net, the interconnect capacitance for he net is predicted based on the value of $\alpha$ and upon the number of components connected to the net. Since $\alpha$ measures how tightly are connected the components of a net, the greater the value of $\alpha$, the shorter the expected length of the wires of the net. Hence, for any method to predict interconnect capacitance based on $\alpha$, the predicted interconnect capacitance should decrease when $\alpha$ increases. Similarly, the greater the number of components connected to the net, the greater the total length of wire. Hence, for any method predicting interconnect capacitance based on the number of components connected to the net, the predicted capacitance should increase with an increase of the number of components connected to the net. One formula which satisfies the above criteria and may thus be used for this prediction is as follows:

$$C = (c_1 + c_2 * N)/\alpha$$

where C is the predicted capacitance for the net, N is the number of components for the net and $c_1$ and $c_2$ are constants that are determined for a particular technology. For instance, for one micron CMOS technology used on a 400 mill square integrated circuit, a typical value for $c_1$ is 0.03 picofarads and a typical value for $c_2$ is 0.1 picofarads.

The foregoing discussion discloses and describes merely exemplary methods and embodiments of the present invention. As will be understood by those familiar with the art, the invention may be embodied in other specific forms without departing from the spirit or essential characteristics thereof. For example, in the disclosed preferred embodiment, the value $\alpha$ increases with more tightly connected nets. Alternately, the value $\alpha$ could be defined to decrease with more tightly connected nets. Accordingly, the disclosure of the present invention is intended to be illustrative, but not limiting, of the scope of the invention, which is set forth in the following claims.

I claim:

1. A method for use in producing an integrated circuit, the method comprising the steps of:
   (a) placing components and connection nets to form the integrated circuit; and,
   (b) estimating the interconnect capacitance of a first net in the integrated circuit, including the substeps of
      (b.1) generating a value which indicates how tightly connected to one another are components connected to the first net, and
      (b.2) predicting interconnect capacitance of the first net based on the value generated in step (b.1) and a number representing how many components are connected to the first net.

2. A method as in claim 1 wherein in substep (b.2) the predicted interconnect capacitance increases when the number representing how many components are connected to the first net increases, and the predicted interconnect capacitance decreases when the value generated in substep (b.1) increases.

3. A method as in claim 1 wherein in substep (b.2) the predicted interconnect capacitance is equal to a ratio of a sum to the value generated in substep (b.1), the sum being equal to a first constant plus a product of a second constant times the number representing how many components are connected to the first output.

4. A method as in claim 1 wherein substep (b.1) includes the following substeps:
   (b.1) for each component connected to the first net, ascertaining a number of components that can be reached without traversing the first net and by traversing no more than a preselected maximum number of nets in the integrated circuit;
   (b.1.2) detecting a total number of components in a union of all components that can be reached from a component connected to the first net without traversing the first net and by traversing no more than a preselected maximum number of nets int he integrated circuit; and,
   (b.1.3) setting the value equal to the ratio of a sum of all the numbers ascertained in substep (b.1.1) to the total number calculated in substep (b.1.2).

5. A method as in claim 4 wherein in substep (b.2) the predicted interconnect capacitance increases when the number representing how many components are connected to the first net increases, and the predicted interconnect capacitance decreases when the value generated in substep (b.1) increases.

6. A method as in claim 4 wherein in substep (b.2) the predicted interconnect capacitance is equal to a ratio of a sum to the value generated in substep (b.1), the sum being equal to a first constant plus a product of a second constant times the number representing how many components are connected to the first output.

7. A method as in claim 1 wherein substep (b.1) includes the following substeps:
   (b.1.1) for each component connected to the first net, determine a fewest number of nets that need to be traversed to reach another component connected to the first net without traversing the first net; and,
   (b.1.2) setting the value equal to one plus, for each component connected to the first net, an inverse of the fewest number determined in substep (b.1.1).

8. A method as in claim 7 wherein in substep (b.2) the predicted interconnect capacitance increases when the number representing how many components are connected to the first net increases, and the predicted interconnect capacitance decreases when the value generated in substep (b.1) increases.

9. A method as inc claim 7 wherein in substep (b.2) the predicted interconnect capacitance is equal to a ratio of a sum to the value generated in substep (b.1), the sum being equal to a first constant plus a product of a second constant times the number representing how many components are connected to the first output.

10. A method for use in producing an integrated circuit, the method comprising the steps of:
   (a) placing components and connection nets to form the integrated circuit; and,
   (b) estimating the interconnect capacitance of a first net in the integrated circuit, including the substeps of
      (b.1) generating a value which indicates how tightly connected to one another are components connected to the first net, including the following substeps:
         (b.1.1) for each component connected to the first net, ascertaining a number of components that can be reached without traversing the first net and by traversing no more than a preselected maximum number of nets in the integrated circuit,
         (b.1.2) detecting a total number of components in a union of all components that can be reached from a component connected to the first net without traversing the first net and by traversing no more than a preselected maximum number of nets in the integrated circuit, and
         (b.1.3) setting the value equal to the ratio of a sum of all the numbers ascertained in substep (b.1.1) to the total number calculated in substep (b.1.2), and
      (b.2) using the value generated in substep (b.1) to predict interconnect capacitance of the first net.

11. A method for use in producing an integrated circuit, the method comprising the steps of:
   (a) placing components and connection nets to form the integrated circuit; and,
   (b) estimating the interconnect capacitance of a first net in the integrated circuit, including the substeps of
      (b.1) generating a value which indicates how tightly connected to one another are components connected to the first net, including the following substeps:
         (b.1.1) for each component connected to the first net, determine a fewest number of nets that need to be traversed to reach another component connected to the first net without traversing the first net, and
         (b.1.2) setting the value equal to one plus, for each component connected to the first net, an inverse of the fewest number determined in substep, and
      (b.2) using the value generated in substep (b.1) to predict interconnect capacitance of the first net.

* * * * *